(12) United States Patent
Jiang et al.

(10) Patent No.: US 11,508,591 B2
(45) Date of Patent: Nov. 22, 2022

(54) HIGH RESOLUTION ELECTRON BEAM APPARATUS WITH DUAL-APERTURE SCHEMES

(71) Applicant: KLA Corporation, Milpitas, CA (US)

(72) Inventors: Xinrong Jiang, Palo Alto, CA (US); Christopher Sears, Fremont, CA (US); Nikolai Chubun, San Jose, CA (US); Luca Grella, Gilroy, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/170,871

(22) Filed: Feb. 8, 2021

(65) Prior Publication Data

US 2022/0254667 A1 Aug. 11, 2022

(51) Int. Cl.
*H01J 37/147* (2006.01)
*H01L 21/67* (2006.01)
*G01N 23/00* (2006.01)
*H01J 37/21* (2006.01)

(52) U.S. Cl.
CPC ....... *H01L 21/67288* (2013.01); *G01N 23/00* (2013.01); *H01J 37/147* (2013.01); *H01J 37/21* (2013.01); *G01N 2223/6116* (2013.01)

(58) Field of Classification Search
CPC .............. H01L 21/67288; G01N 23/00; G01N 2223/6116; H01J 37/147; H01J 37/21
USPC ............... 250/306, 307, 492.1–492.3
See application file for complete search history.

(56) References Cited

U.S. PATENT DOCUMENTS

| 3,846,660 | A | 11/1974 | Wolfe et al. | |
| 6,590,210 | B1 | 7/2003 | Essers | |
| 6,861,187 | B2 | 3/2005 | Yahiro | |
| 7,435,956 | B2 * | 10/2008 | Parker | H01J 9/42 250/398 |
| 8,168,951 | B2 | 5/2012 | Kawasaki et al. | |
| 10,141,160 | B2 | 11/2018 | Ren et al. | |
| 10,522,319 | B2 | 12/2019 | Kasuya et al. | |
| 10,964,522 | B2 * | 3/2021 | Jiang | H01J 49/48 |
| 2019/0323976 | A1 * | 10/2019 | Vinshtein | G01N 23/223 |
| 2019/0371564 | A1 * | 12/2019 | Sears | H01J 37/241 |
| 2019/0378705 | A1 * | 12/2019 | Jiang | H01J 37/05 |

FOREIGN PATENT DOCUMENTS

KR 20190111730 A 10/2019

OTHER PUBLICATIONS

WIPO, ISR for International Application No. PCT/US2022/013959, May 17, 2022.

* cited by examiner

*Primary Examiner* — Michael Maskell
(74) *Attorney, Agent, or Firm* — Hodgson Russ LLP

(57) ABSTRACT

An electron source emits an electron beam. The electron beam is received by a beam limiting assembly. The beam limiting assembly has a first beam limiting aperture with a first diameter and a second beam limiting aperture with a second diameter larger than the first diameter. The first beam limiting aperture receives the electron beam. This beam limiting assembly reduces the influence of Coulomb interactions.

21 Claims, 13 Drawing Sheets

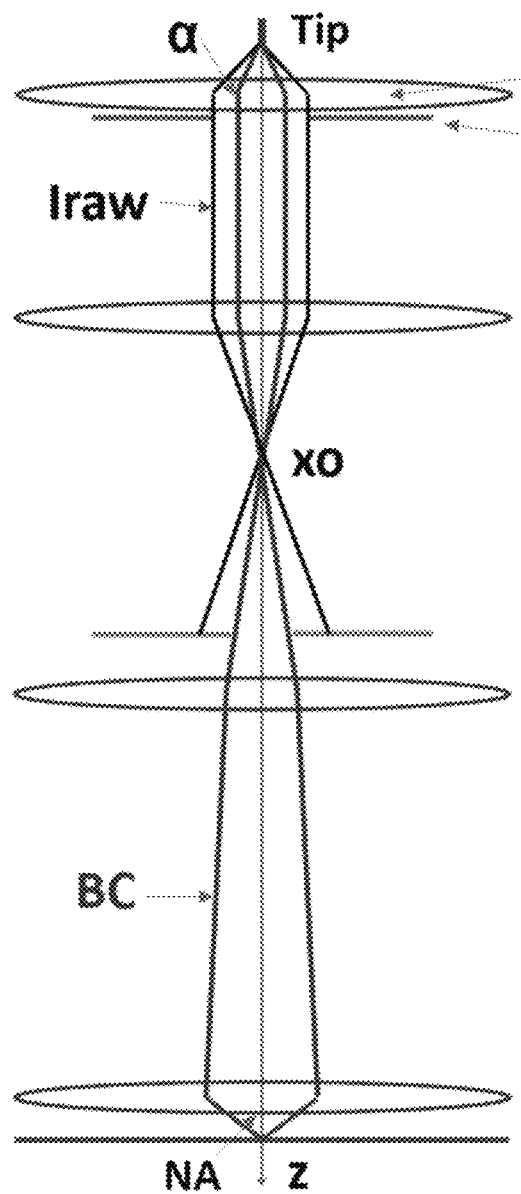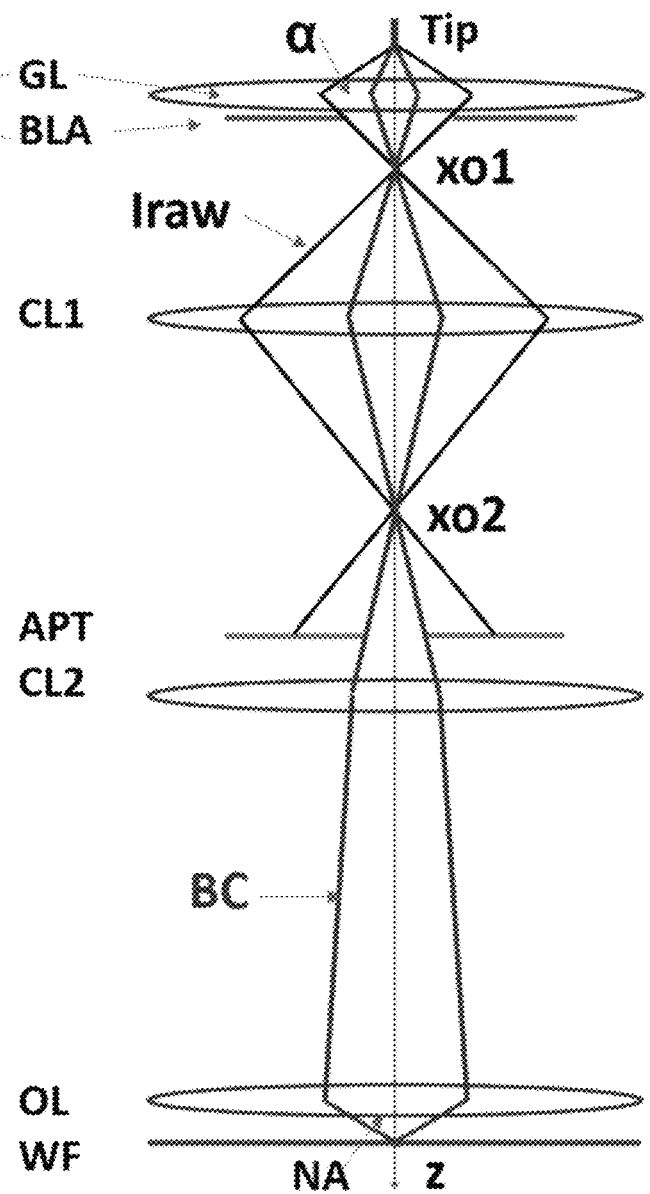
FIG. 2A (PRIOR ART)
FIG. 2B (PRIOR ART)

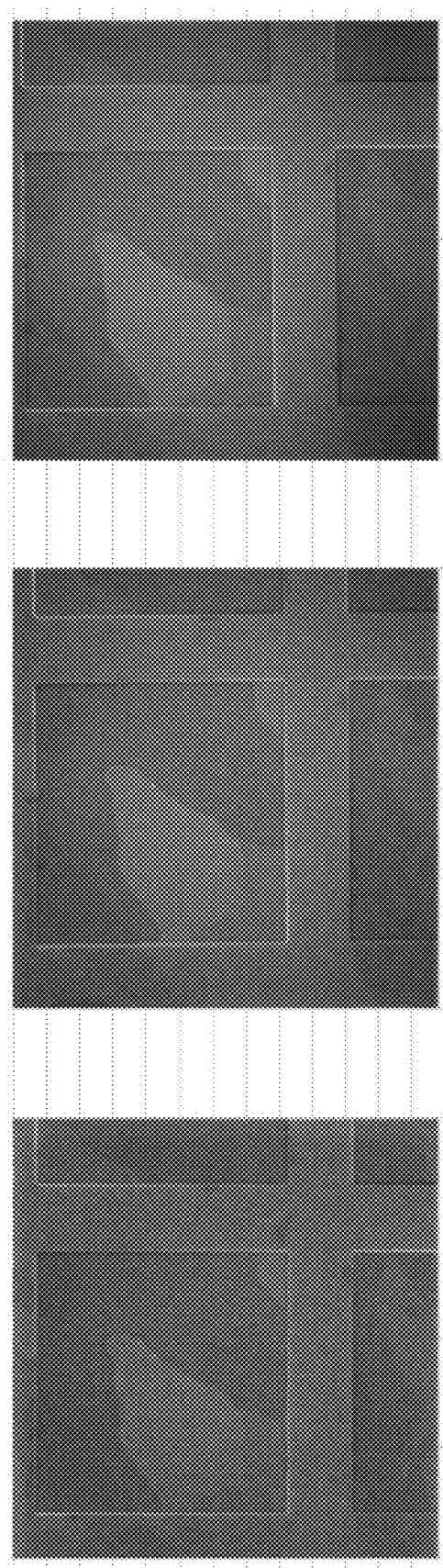
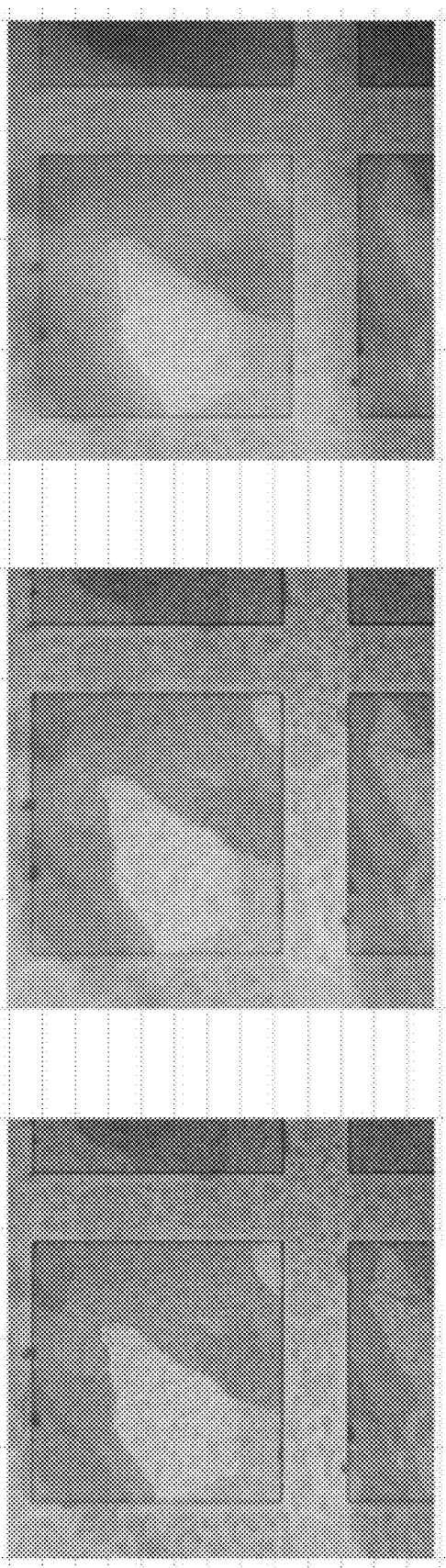
FIG. 12A  FIG. 12B  FIG. 12C  FIG. 12D  FIG. 12E  FIG. 12F

HIGH RESOLUTION ELECTRON BEAM APPARATUS WITH DUAL-APERTURE SCHEMES

FIELD OF THE DISCLOSURE

This disclosure relates to electron beam systems.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. An arrangement of multiple semiconductor devices fabricated on a single semiconductor wafer may be separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

As design rules shrink, however, semiconductor manufacturing processes may be operating closer to the limitation on the performance capability of the processes. In addition, smaller defects can have an impact on the electrical parameters of the device as the design rules shrink, which drives more sensitive inspections. As design rules shrink, the population of potentially yield-relevant defects detected by inspection grows dramatically, and the population of nuisance defects detected by inspection also increases dramatically. Therefore, more defects may be detected on the wafers, and correcting the processes to eliminate all of the defects may be difficult and expensive. Determining which of the defects actually have an effect on the electrical parameters of the devices and the yield may allow process control methods to be focused on those defects while largely ignoring others. Furthermore, at smaller design rules, process-induced failures, in some cases, tend to be systematic. That is, process-induced failures tend to fail at predetermined design patterns often repeated many times within the design. Elimination of spatially-systematic, electrically-relevant defects can have an impact on yield.

A focused electron beam system (e-beam) is commonly used to create or examine the microstructure of articles, such as a silicon wafer used in the fabrication of integrated circuits. The electron beam is formed with electrons that are emitted from an emitter in an electron gun, which acts as a fine probe when it interacts with the wafer for examining microstructures.

FIG. 1 is an embodiment of a previous embodiment of an electron gun to generate an electron beam. In a thermal field emission (TFE) mechanism, an extractor controls the emission brightness of the electrons from the tip. A suppressor controls the focus (trajectories) of the electrons. The electrons are accelerated by an anode to certain beam energies (BE), such as 10 kV, 20 kV, or 30 kV. The design of an anode may vary. For instance, the beam limiting aperture (BLA) and the holder of the BLA in FIG. 1 constitute the anode. The anode is mostly grounded. The pole piece and coil of a magnetic gun lens is typically sealed in air to reduce the contamination of the high vacuum, which can be necessary for electron emissions and electron optics.

The pole pieces of the magnetic gun lens are designed to immerse the electron source in the focusing magnetic fields for making the focus distance short and gun lens aberration small. Accordingly, the equivalent gun lens (GL) is formed in between the tip and BLA as shown in FIG. 1. FIG. 1 shows the optics of an electron gun in which most of emission electrons are stopped by the BLA, and the BLA only selects the central portion of electrons in a solid angle of a to form the raw beam current (Iraw) for wafer examination applications such as reviews and inspections of semiconductor wafers. The current through the magnetic lens coils controls the focus of the electron beam selected by the BLA. The BLA-selected electron beam may either be focused to form a beam crossover (xo) or defocused to illuminate the follow-up lenses in an electron beam column optics.

FIGS. 2A-2B show previous focused electron beam optics. To select a large range of beam currents (e.g., approximately 0.1 nA to 500 nA) for various uses with a fixed BLA and column aperture (APT), and to optimize the resolution at the wafer (WF) for each beam current, a four-lens optical configuration in FIGS. 2A-2B is used. FIG. 2A is the optics for the uses with low beam currents (e.g., approximately 0.1 nA to 30 nA) and FIG. 2B is the optics for the uses with high beam currents (e.g., approximately 30 nA to 500 nA).

In FIG. 2A, the electrons in the raw beam current (Iraw) selected by the BLA are focused by the first condenser lens (CL1) to form a crossover (xo) in between the CL1 and APT and then to illuminate the APT. The APT selects the beam currents (BCs) from the raw current Iraw. The second condenser lens (CL2) and the objective lens (OL) are used to optimize the numeric aperture (NA, i.e. the electron beam focusing angle at wafer) to minimize the aberration blurs (i.e., to minimize the combination of the lens spherical aberration, lens chromatic aberration, and diffraction aberration as well as the blurs caused by the Coulomb interactions between electrons). The CL1 and CL2 may be either electrostatic lenses or magnetic lenses. The objective lens (OL) may be an immersed magnetic lens combined with electrostatic retarding fields for decelerating the electrons from the beam energy (BE) to landing energy (LE).

In FIG. 2B, the tip-emitted electrons are strongly focused by the gun lens (GL) to form the first crossover (xo1) in between the BLA and CL1. The BLA-selected Iraw in FIG. 2B is higher than that in FIG. 2A because the emission angle α in FIG. 2B is greater than that in FIG. 2A. The APT selects higher beam currents through the CL1 focusing at the second crossover (xo2) and the CL2 selects the optimal NA for the best resolution in the uses with higher BCs.

Degradation of optical resolutions due to Coulomb interactions between electrons can occur in the designs of FIGS. 2A-2B, which can impede operation. The higher the raw beam currents (Iraw), the worse the optical resolutions will be.

Given a BC for a certain use, the residual electrons in a beam current of (Iraw-BC) between the BLA and APT will generate extra optical blurs at the wafer, which degrades optical resolutions. In one example, given an Iraw of 30 nA in FIG. 2A, there are 29 nA residual electrons if the BC is selected as 1 nA for the use of wafer review. These 29 nA electrons will generate extra Coulomb interactions (CI) blurs to degrade optical resolutions. In another example, given an Iraw of 200 nA in FIG. 2B, there are 150 nA residual electrons if the BC is selected as 50 nA for the wafer inspection of physical deflects. These 150 nA electrons will generate extra CI blurs to degrade the resolution for the use with a 50 nA BC.

The Coulomb interactions not only degrade the resolution in the central portion of an electron beam spot, but also make a longer and wider tail of the beam electron distributions, which pollutes the useful signals extracted by the central electrons of the beam.

Using the design of FIG. 2B, computer simulations with a Monte Carlo method show how the electrons on the wafer are distributed under the best focus of the complete optics from tip to wafer, as shown in FIGS. 3A-3B. Given a 100 nA Iraw in FIG. 2B for 50 nA BC used with a 10 kV BE and 1 keV LE, FIG. 3A shows how the electrons on the wafer are distributed with a long tail and blurred spot. The spot size (or the resolution) in an electron optics can be defined with the central portion of the distributed electrons. For instance, FWxx is used to define the Full Width spot size inside which xx % (e.g., FW50→50%) of the total electrons in a beam current is included. Using the FW50, FW75, and FW85 to measure the electron distributions in FIG. 3A, FIG. 3B shows how the central spot sizes are changed with the tails of electron distributions.

Therefore, improved systems and methods for generating an electron beam are needed.

BRIEF SUMMARY OF THE DISCLOSURE

A system is provided in a first embodiment. The system includes an electron source configured to emit an electron beam; a suppression electrode disposed proximate the electron source; an extraction electrode disposed proximate the electron source; a beam limiting assembly; and at least one pole piece disposed adjacent the beam limiting assembly. The beam limiting assembly defines a first beam limiting aperture with a first diameter, a second beam limiting aperture with a second diameter, and a channel between the first beam limiting aperture and the second beam limiting aperture. The channel has a third diameter larger than that of the first diameter of the first beam limiting aperture and the second diameter of the second beam limiting aperture. The beam limiting assembly is positioned to receive the electron beam in the first beam limiting aperture.

The beam limiting assembly can include a flange on a surface of the beam limiting assembly that receives the electron beam from the electron source. The flange is disposed between the electron source and the at least one pole piece.

The first beam limiting aperture can be disposed closer to the electron source than the second beam limiting aperture.

The beam limiting aperture can further include a transition region between the first beam limiting aperture and the channel. The transition region has a diameter that increases from the first diameter to the third diameter. The transition region has a length along the direction of the electron beam that is from 1 mm to 10 mm. The third diameter may be configured to stop a majority of the secondary electrons without clipping the primary electrons.

The first diameter can be from 1.5 to 5.0 times larger than the second diameter.

The system can further include an objective lens, an aperture disposed in a path of the electron beam between the beam limiting assembly and the objective lens, and a condenser lens disposed in the path of the electron beam between the aperture and the beam limiting assembly.

The system can further include an objective lens, an aperture disposed in a path of the electron beam between the beam limiting assembly and the objective lens, and a condenser lens disposed in the path of the electron beam between the aperture and the objective lens.

The beam limiting assembly can define a recess on the surface that receives the electron beam from the electron source. The first beam limiting aperture is disposed in a base of the recess. The recess has a fourth diameter that is larger than the first diameter and the second diameter.

The second beam limiting aperture can be spaced apart from the first beam limiting aperture from 5 mm to 10 mm along a path of the electron beam.

In an instance, the third diameter is approximately 1 mm in diameter and the length of the channel is approximately 6 mm to 12 mm.

A method is provided in a second embodiment. The method includes forming an electron beam and directing the electron beam through a beam limiting assembly. The beam limiting assembly defines a first beam limiting aperture with a first diameter, a second beam limiting aperture with a second diameter, and a channel between the first beam limiting aperture and the second beam limiting aperture. The channel has a third diameter larger than that of the first diameter of the first beam limiting aperture and the second diameter of the second beam limiting aperture. The beam limiting assembly is positioned to receive the electron beam in the first beam limiting aperture.

In an instance, a beam current of the electron beam is from 1 nA to 100 nA.

The method can further include focusing the electron beam to form a crossover after the electron beam exits the beam limiting assembly.

The method can further include defocusing the electron beam after the electron beam exits the beam limiting assembly.

The method can further include directing the electron beam through a condenser lens that is activated and disposed downstream along a path of the electron beam from the beam limiting assembly, an aperture disposed downstream along the path of the electron beam from the condenser lens, and an objective lens disposed downstream along the path of the electron beam from the aperture. In an instance, a beam current of the electron beam may be from 0.1 nA to 20 nA or from 60 nA to 500 nA.

The method can further include directing the electron beam through an aperture disposed downstream along a path of the electron beam from the beam limiting assembly, a condenser lens that is activated and disposed downstream along the path of the electron beam from the aperture, and an objective lens disposed downstream along the path of the electron beam from the condenser lens. In an instance, a beam current of the electron beam is from 20 nA to 60 nA.

The method can further include directing the electron beam to a surface of a semiconductor wafer. A beam current selected by the second beam limiting aperture is equal to a beam current at the surface of the semiconductor wafer.

The method can further include directing the electron beam through a recess on a surface of the beam limiting assembly that receives the electron beam from the electron source. The first beam limiting aperture is disposed in a base of the recess. The recess has a fourth diameter that is larger than the first diameter and the second diameter.

The electron beam can pass through a channel between the first beam limiting aperture and the second beam limiting aperture. The channel has a third diameter larger than that of the first diameter of the first beam limiting aperture and the second diameter of the second beam limiting aperture. The third diameter is configured to stop a majority of the secondary electrons without clipping the primary electrons.

DESCRIPTION OF THE DRAWINGS

For a fuller understanding of the nature and objects of the disclosure, reference should be made to the following detailed description taken in conjunction with the accompanying drawings, in which:

FIGS. 2A-2B are embodiments of a previous embodiment of electron beam optics;

FIGS. 12A-12F are optical images from experiments using the embodiments disclosed herein.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

The performance of a focused electron beam apparatus is generally characterized by the spot size (resolution) at a given beam current (throughput). To get high throughputs with high beam currents and high resolutions with small spot sizes, one approach is to reduce Coulomb interactions between the electrons in high beam currents after the geometric aberrations of lenses have been minimized.

Embodiments herein disclose a dual-aperture concept for building up a high-resolution electron gun by reducing the influence of Coulomb interactions as the electrons move in the gun region because the trajectory displacement effect due to Coulomb interactions causes distance-accumulated blurs. Simulations and experiments show improvements to electron beam resolutions for high beam currents.

The effect of resolution (spot size) degradation due to Coulomb interactions is referred to as trajectory displacement effect. The electron beam spot blur due to the trajectory displacement effect, dTD, is a distance-accumulated effect provided by the following Equation 1.

$$d_{TD} = \int_{Z\_source}^{Z\_wafer} (Z\_wafer - z) F[r(z), V(z), I(z)] dz \quad (1)$$

In this equation, z is the optical axis from the tip (Z_source) to wafer (Z_wafer), and the F is a function of the beam profile trajectory r(z), the beam voltage or beam energy V(z), and the beam current I(z) from the tip to wafer.

For the designs of FIGS. 2A-2B, the integration in the equation may be divided into two regions. One region is the integration from tip (Z_source) to the column aperture (Z_APT) with the function F[r(z), V(z), Iraw], and the other region is the integration from the column aperture (Z_APT) to the wafer (Z_wafer) with the function F[r(z), V(z), BC]. If the BC is less than Iraw, the shorter the distance (Z_APT-Z_source), the smaller the CI (Coulomb Interactions) blur $d_{TD}$ in Equation 1 will be.

Figure 4:
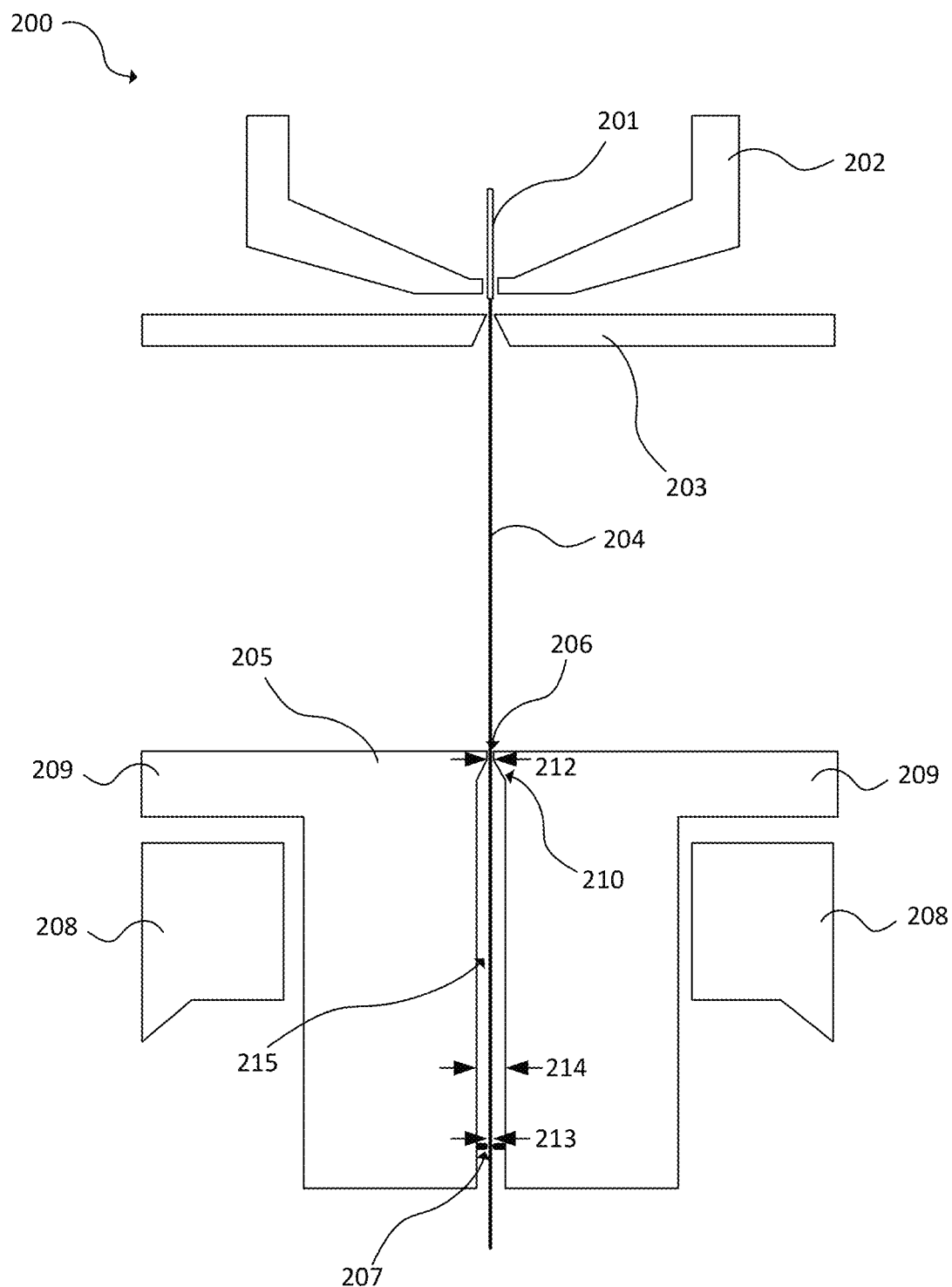
FIG. 4 is an embodiment of an electron gun with dual apertures in accordance with the present disclosure.

FIG. 4 illustrates an embodiment of an electron gun with dual apertures, which reduces CI blur. The system 200 includes an electron source 201 that emits an electron beam 204. The electron source 201 may be or include a tip. A suppression electrode 202 and extraction electrode 203 are disposed proximate the electron source 201.

A beam limiting assembly 205 defines at least two beam limiting apertures. A first beam limiting aperture 206 (also referred to as BLA1) has a first diameter 212. A second beam limiting aperture 207 (also referred to as BLA2) has a second diameter 213. The second diameter 213 may be smaller than the first diameter 212. For example, the first diameter 212 may be from 1.5 to 5.0 times larger than the second diameter 213. In an instance, the first beam limiting aperture 206 is approximately two to three times larger than the second beam limiting aperture 207. The first beam limiting aperture 206 is larger than the second beam limiting aperture 207 so sufficient electrons illuminate the second beam limiting aperture 207, and the disclosed ranges provide this effect. The second beam limiting aperture 207 may be positioned proximate the electron source 201 to reduce the Coulomb interactions. For example, in FIG. 4, the aperture is moved close to the electron source 201 to reduce Coulomb interaction effects (i.e., moving the aperture up more than 100 mm, or >¼ column length, from the original position (the OH-open-hole position) to the BLA2 position).

Figure 8:
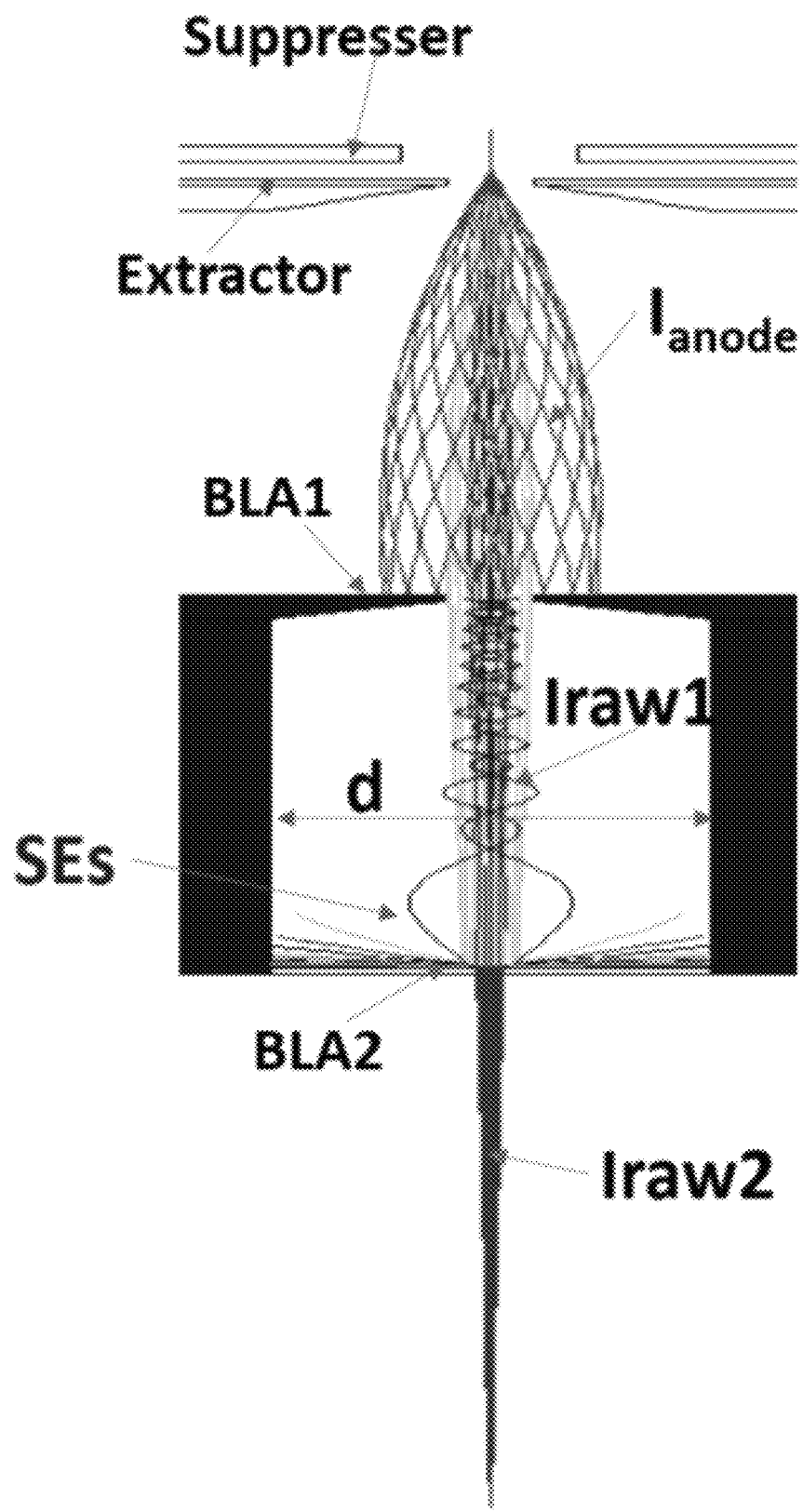
FIG. 8 shows Coulomb interactions between the primary electrons (PEs) and secondary electrons (SEs) in the region between BLA1 and BLA2.

In general, the aperture may be moved to a position at which the gun magnetic field penetration is weak and the secondary electrons from the BLA2 can be mostly clipped by the SE channel wall before they are strongly focused by the penetrated magnetic field of the gun lens, which is shown in FIG. 8. In an instance, the BLA2 is moved up and below the BLA1 approximately 5 mm to 10 mm or 5 mm to 20 mm.

In an example using FIG. 4, the first beam limiting aperture 206 has a diameter of 150 μm and the second beam limiting aperture 207 has a diameter of 60 μm. These dimensions may be used to select a beam current from 1 nA to 500 nA. A beam current from 1 nA to 100 nA is normally for image-forming in review and inspections. A beam current from 100 nA to 500 nA is normally for flood-charging on wafer for voltage contrast (VC) inspections. The first beam limiting aperture 206 and second beam limiting aperture 207 may be optimized for a particular application or a particular beam current.

The beam limiting assembly 205 also includes a channel 215 with a third diameter 214. The third diameter 214 is larger than the first diameter 212 or second diameter 213. The channel 215 is between the first beam limiting aperture 206 and the second beam limiting aperture 207, thereby connecting the first beam limiting aperture 206 and the second beam limiting aperture 207. An electron beam 204 can pass through the first beam limiting aperture 206, channel 215, and second beam limiting aperture 207.

Figure 9:
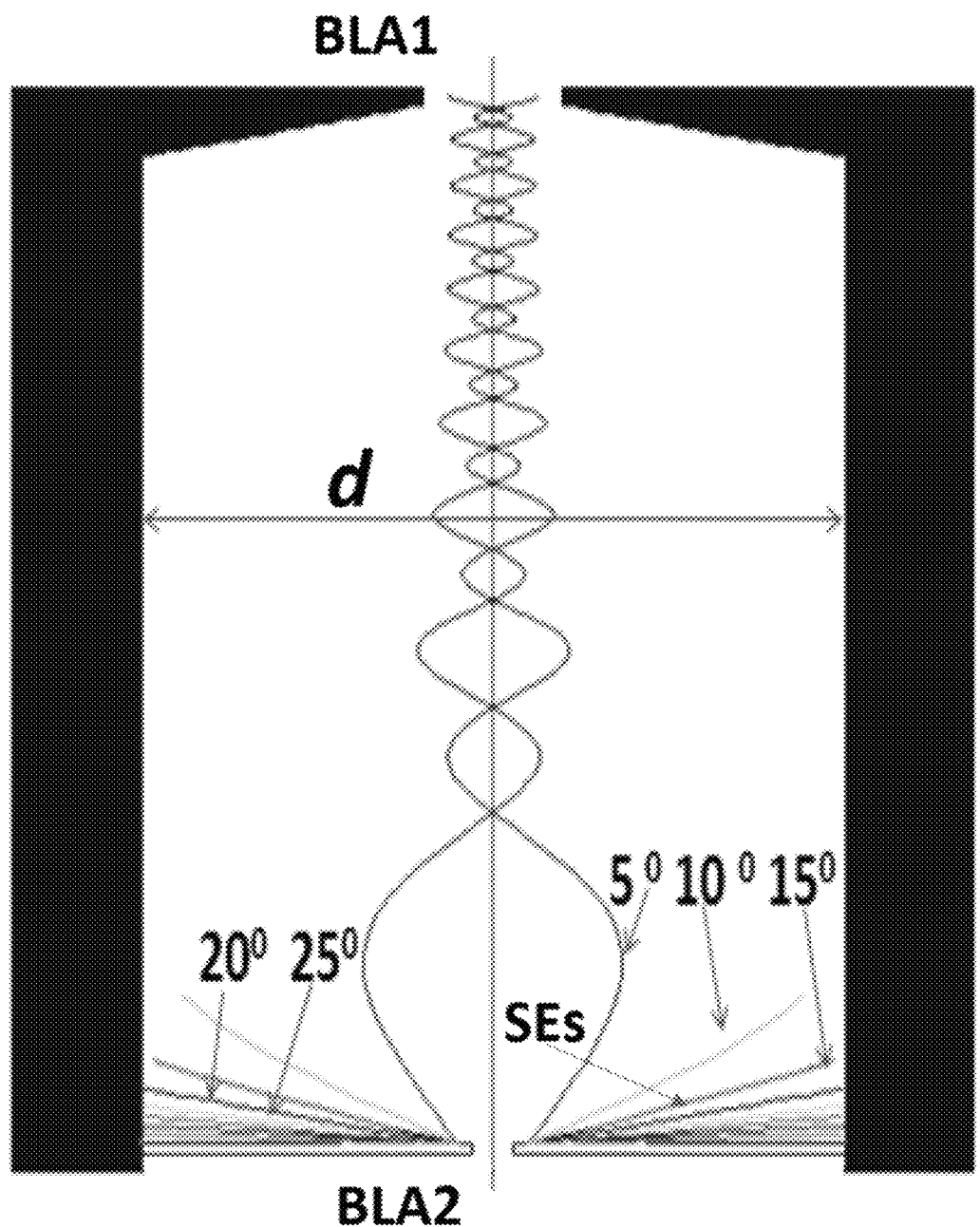
FIG. 9 illustrates a narrow channel between BLA1 and BLA2 to reduce secondary electron moving paths.
Figure 10:
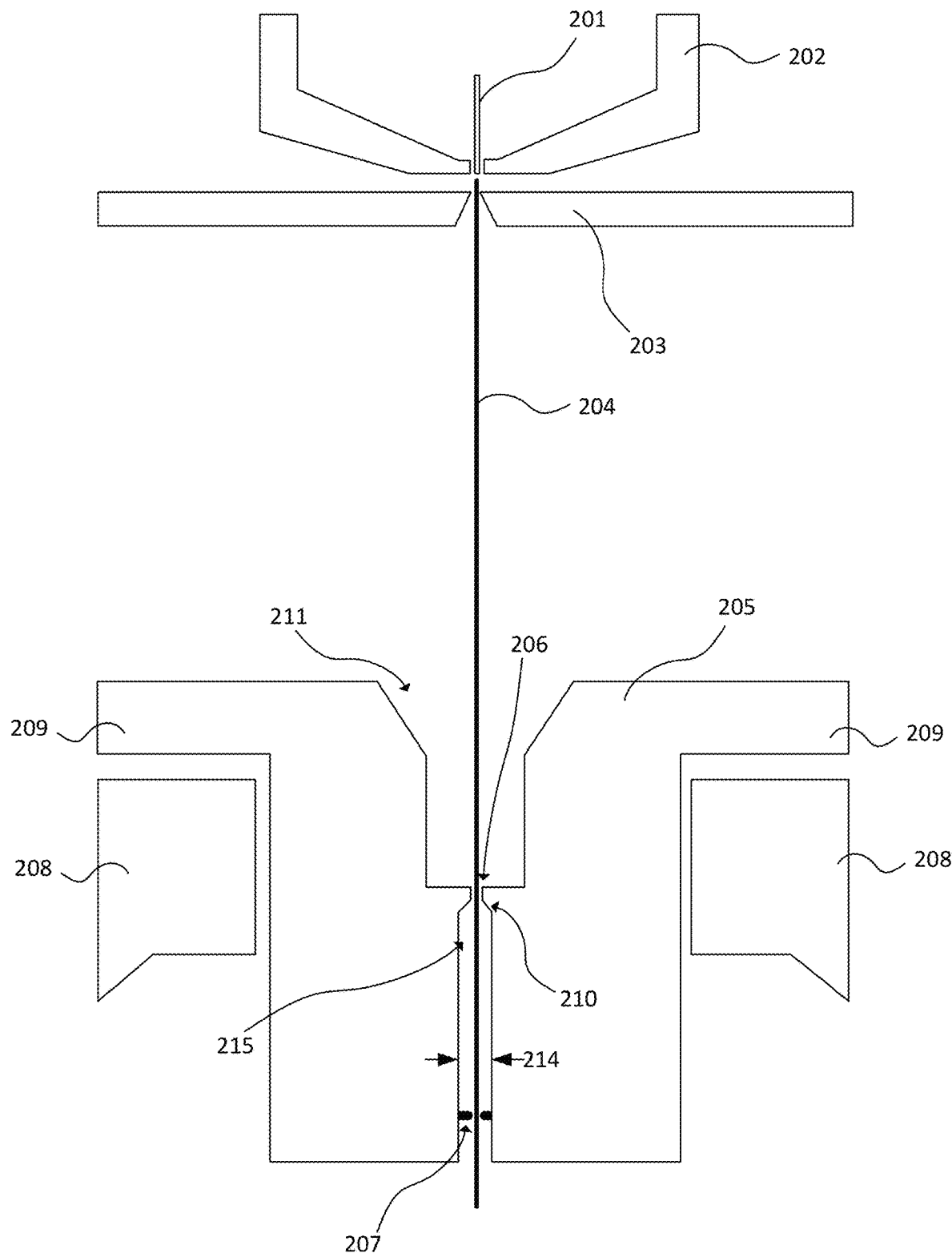
FIG. 10 is an embodiment of an electron gun with dual apertures and a recessed anode.

In an example, the third diameter 214 is approximately 1 mm in diameter and the length of the channel 15 is approximately 6 mm to 12 mm (i.e., from the first beam limiting aperture 206 to the second beam limiting aperture 207). The third diameter 214 can stop most of SEs without clipping the PEs. The channel 15 length in FIG. 4, FIG. 8, and FIG. 9 is about 12 mm and the channel 15 length in FIG. 10 is about 6 mm.

As shown in FIG. 4, the first beam limiting aperture 206, second beam limiting aperture 207, and channel 215 are in the beam limiting assembly 205. The first beam limiting aperture 206 is disposed closer to the electron source 201 than the second beam limiting aperture 207. Thus, the electron beam 204 enters the first beam limiting aperture 206 before entering the second beam limiting aperture 207.

Figure 1:
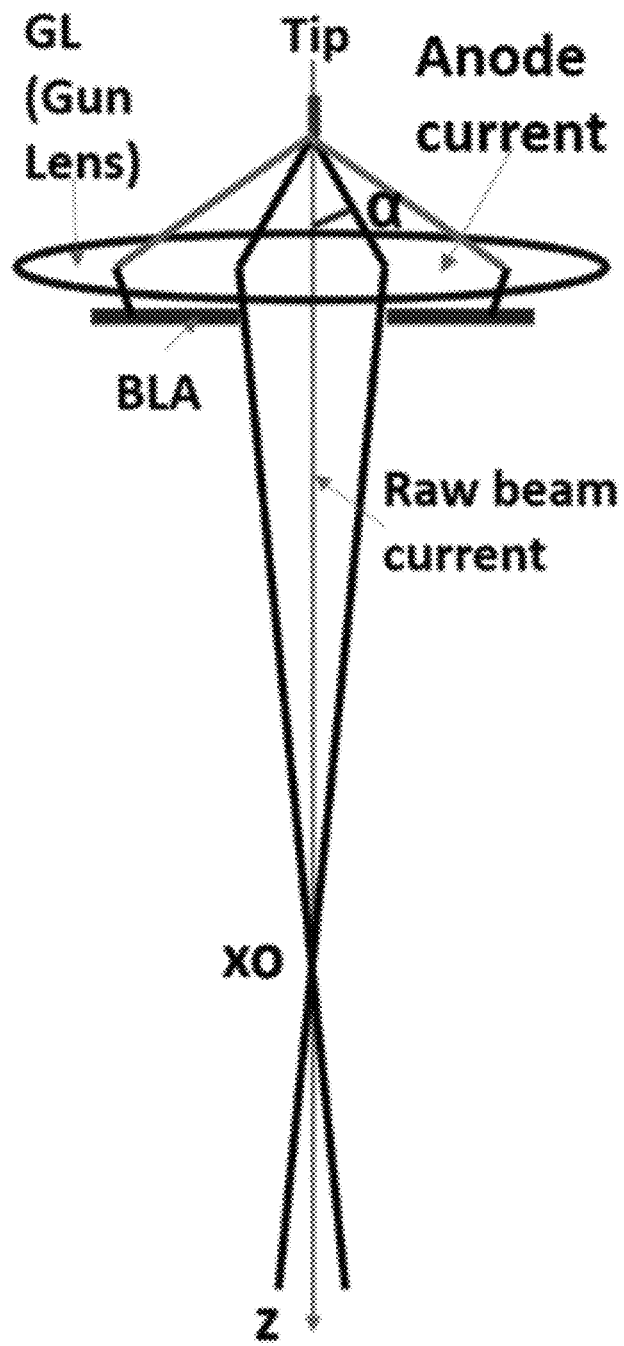
FIG. 1 is an embodiment of a previous embodiment of an electron gun.
Figure 3B:
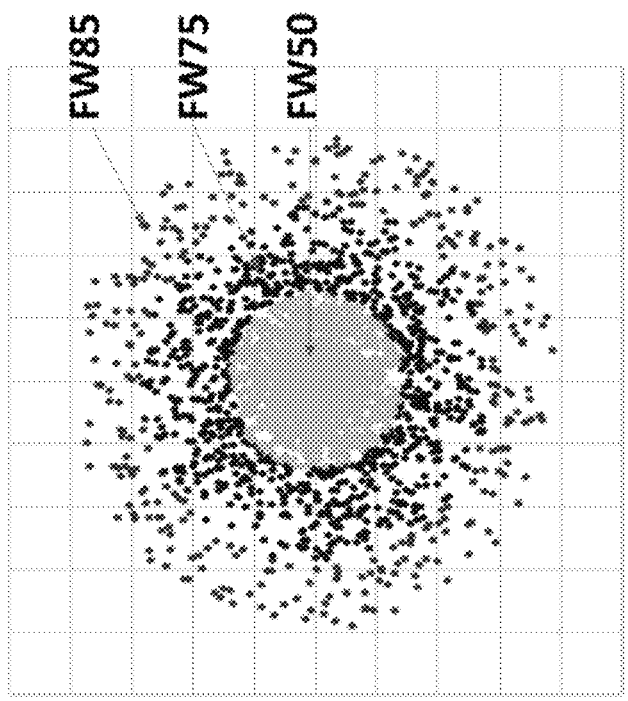
FIGS. 3A-3B are computer simulations of an electron optical configuration showing effects of Coulomb interactions between electrons.
Figure 7:
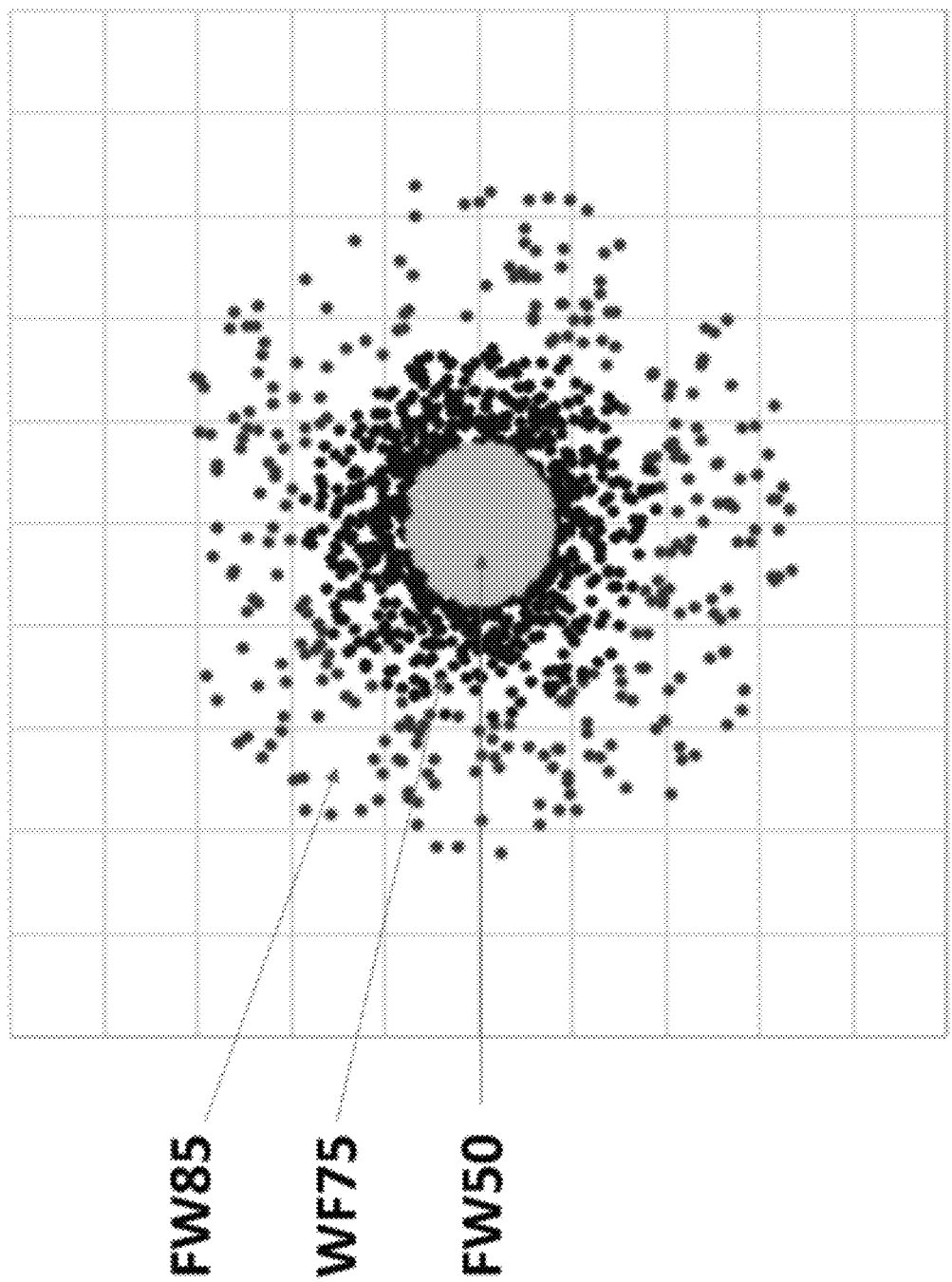
FIG. 7 shows resolution improvements of an electron gun with the beam spot electron distribution with the dual-aperture electron gun of FIG. 4 and FIG. 5.

The second beam limiting aperture 207 can provide a function similar to a column aperture (APT) in FIG. 2. Thus, the function of the column aperture is relocated to the electron gun region, which reduces a distance from the tip (Z_source) and column aperture (Z_APT). This decreases the influence of Coulomb interactions on resolution. As explained herein, FIG. 3B and FIG. 7 have the same scaling. The resolution (or spot size) is normally measured with FW50. The FW50 in FIG. 3B is about 3 divisions and in FIG. 7 is about 1.5 divisions with the same beam current. So the decrease of the spot size with the embodiments disclosed herein is about 2×, or increasing beam current density of approximately 4×. Furthermore, the tails (FW75 & FW85) are narrowed. By comparing FIG. 3B and FIG. 7, the tail is approximately 6 divisions versus approximately 3 divisions for FW75 and approximately 8 divisions versus approximately 6.5 divisions for FW85.

In the theory of Coulomb interactions between electrons, the electron distributions in a beam spot may be divided into a Holtsmark distribution and pencil beam distribution. These are all non-Gaussian distributions. The tails of these distributions are longer than the tail of a standard Gaussian distribution. The Coulomb interactions are responsible for the tails and these Coulomb interactions are worse than a Gaussian tail. In a single electron beam system, the electron distribution is normally a pencil beam distribution. In a multibeam system, the electron distribution is commonly a Holtsmark distribution. The tails of the distributions are, in the same principle as Equation 1, distance-accumulated, such that the tail is narrowed while the column aperture is moved up as closely to the source as possible.

The beam limiting aperture can include a transition region 210 between the first beam limiting aperture 206 and the channel 215. In the transition region 210, the diameter increases from the first diameter 212 to the third diameter 214. Thus, the transition region 210 may be angled or curved relative to the inside surface of the first beam limiting aperture 206 or walls of the channel 215. The transition region 210 can have a length along the direction of the electron beam that is from 1 mm to 10 mm. The optimal case is to stop most of secondary electrons close to the second beam limiting aperture 207, which minimizes the Coulomb interaction between primary electrons and secondary electrons as shown in FIGS. 8-11.

At least one pole piece 208 is disposed adjacent the beam limiting assembly.

The beam limiting assembly 205 can include a flange 209 on a surface of the beam limiting assembly 205 that receives the electron beam 204 from the electron source 201. As shown in FIG. 4, the flange 209 is disposed between the pole piece 208 and the electron source 201. The flange 209 can protect the pole piece 208 from the electron beam 204.

Figure 5:
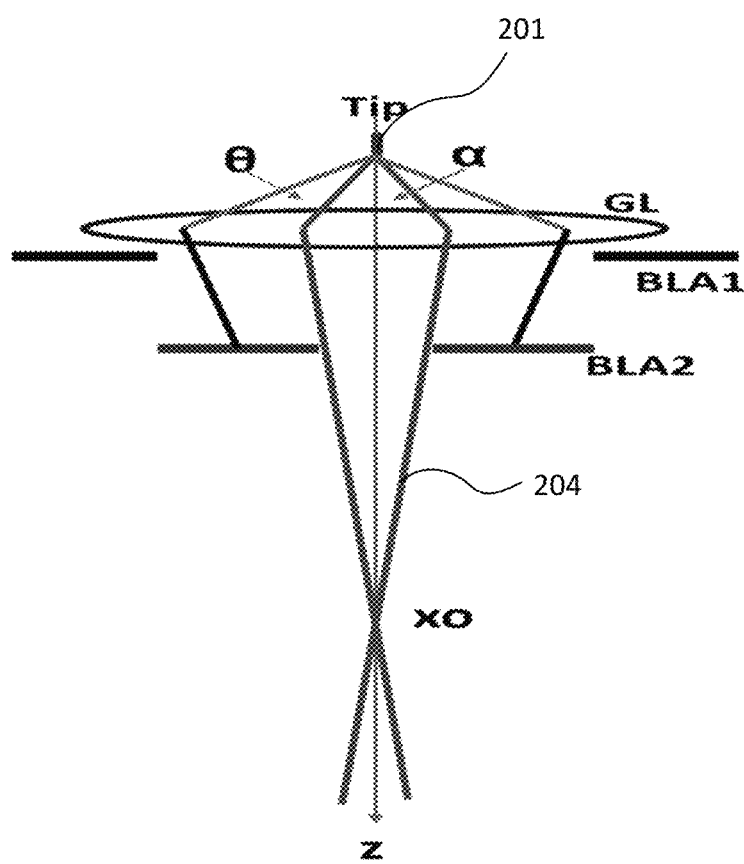
FIG. 5 shows the electron optics of the electron gun of FIG. 4.

The electron gun in the system 200 of FIG. 4 may be described with a gun electron optics in FIG. 5. The gun lens (GL) in FIG. 5 can be a combination of the electrostatic acceleration lens and magnetic focusing lens, positioned between the tip and BLA1 (first beam limiting aperture 206 in FIG. 4). The beam current selected by the BLA2 (second beam limiting aperture 207 in FIG. 4) is the second raw beam current (Iraw2). The beam current selected by the BLA1 is the first raw beam current (Iraw1). The size of a BLA1 is larger than that of a BLA2 (e.g., approximately 1.5 to 5.0 times larger). The distance between the BLA1 and BLA2 can be relatively short, such as a few millimeters. For example, the distance between BLA1 and BLA2 may be from 6 mm to 12 mm. The Iraw1 and Iraw2 are controlled by the excitation of the gun magnetic lens. The electron beam after the BLA2 may be focused to form a crossover (xo) below the BLA2. The electron beam after the BLA2 also may be defocused to form a divergent, telecentric, or convergent beam to illuminate the following-up lenses.

Figure 6C:
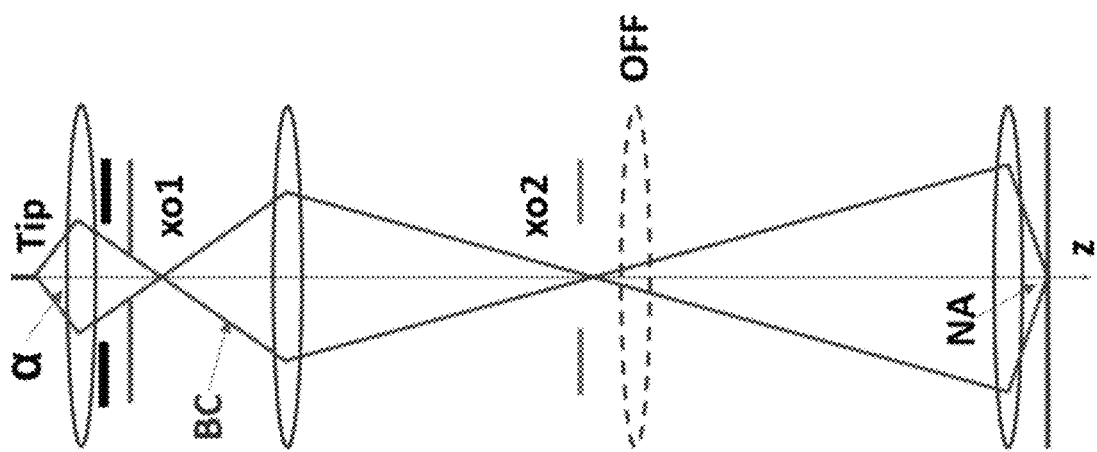
FIGS. 6A-6C illustrate optical configurations using the electron gun of FIG. 4.
Figure 6B:
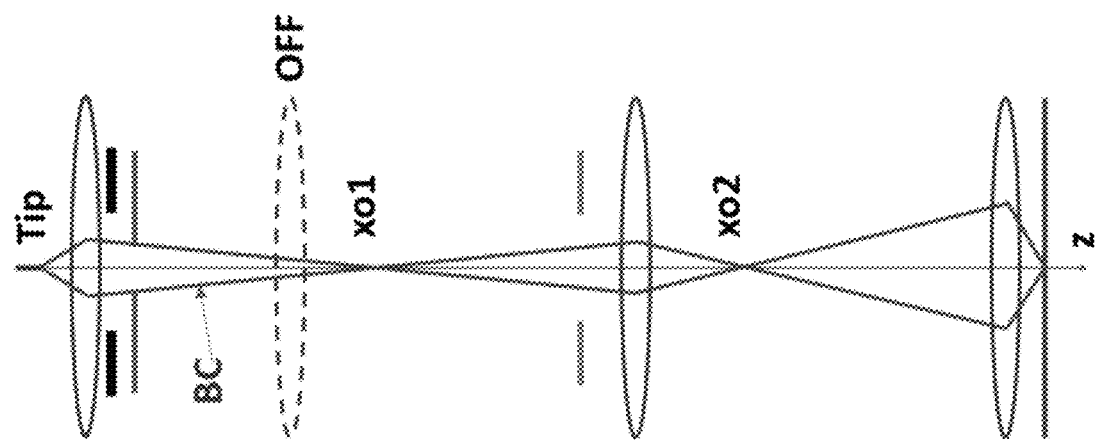
Figure 6A:
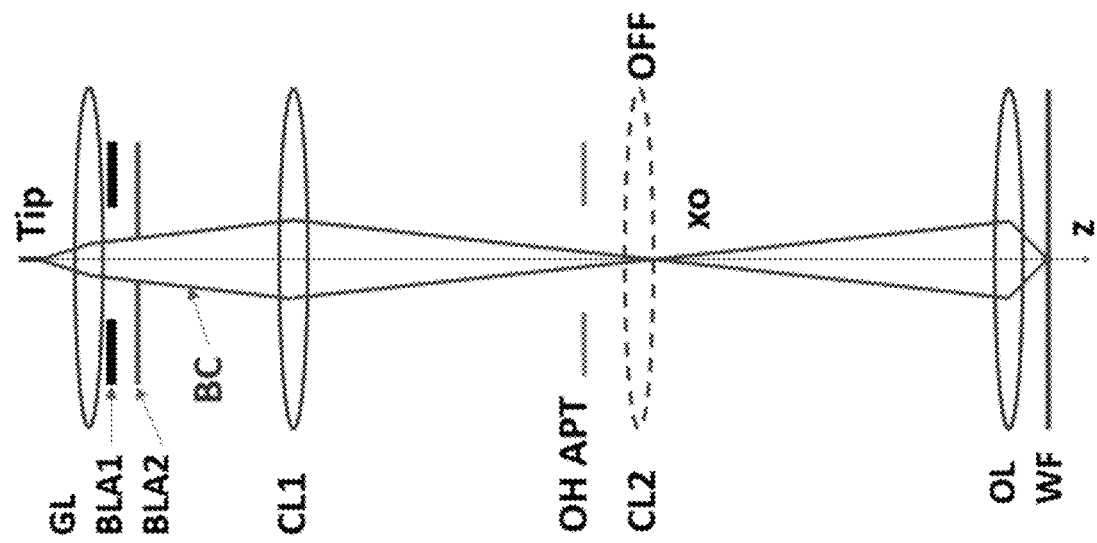

FIGS. 6A-6C illustrate optical configurations using the electron gun of FIG. 4 and the fixed sizes of BLA1 and BLA2. FIG. 6A is an exemplary gun optics for low beam current (e.g., approximately 0.1 nA to 20 nA). FIG. 6B is an exemplary gun optics for medium beam current (e.g., approximately 20 nA to 60 nA). FIG. 6C is an exemplary gun optics for high beam current (e.g., approximately 60 nA to 500 nA).

In FIGS. 6A-6C, the column aperture (APT) in FIG. 2 is now an open hole (OH) used for the electron beam blanking only. The open hole aperture (OH APT) is designed to be large enough without cutting any electrons for the uses of all beam currents.

The electron optical column in FIGS. 6A-6C still includes (or, in an embodiment, consists of) four lenses. This includes the gun lens (GL), the first and second condenser lenses (CL1 and CL2), and the objective lens (OL). The open hole aperture may be disposed in a path of the electron beam between the beam limiting assembly and the objective lens. The condenser lens can be disposed in the path of the electron beam between the aperture and the beam limiting assembly or the aperture and the objective lens.

Only three lenses may be used for a particular beam current during operation. For instance, the CL2 is off operation in FIG. 6A and FIG. 6B. In another instance, the CL1 is off operation in FIG. 6B.

Because of the short distance between the BLA1 and BLA2 (e.g., a few millimeters), the distance-accumulated blurs due to the Coulomb interactions between the residual electrons (Iraw1-Iraw2) can be reduced enough that they may be negligible. Accordingly, the final beam currents (BC) can be directly equal to or nearly equal to Iraw2 if the open hole aperture is not clipping electrons from the beam currents.

Figure 3A:
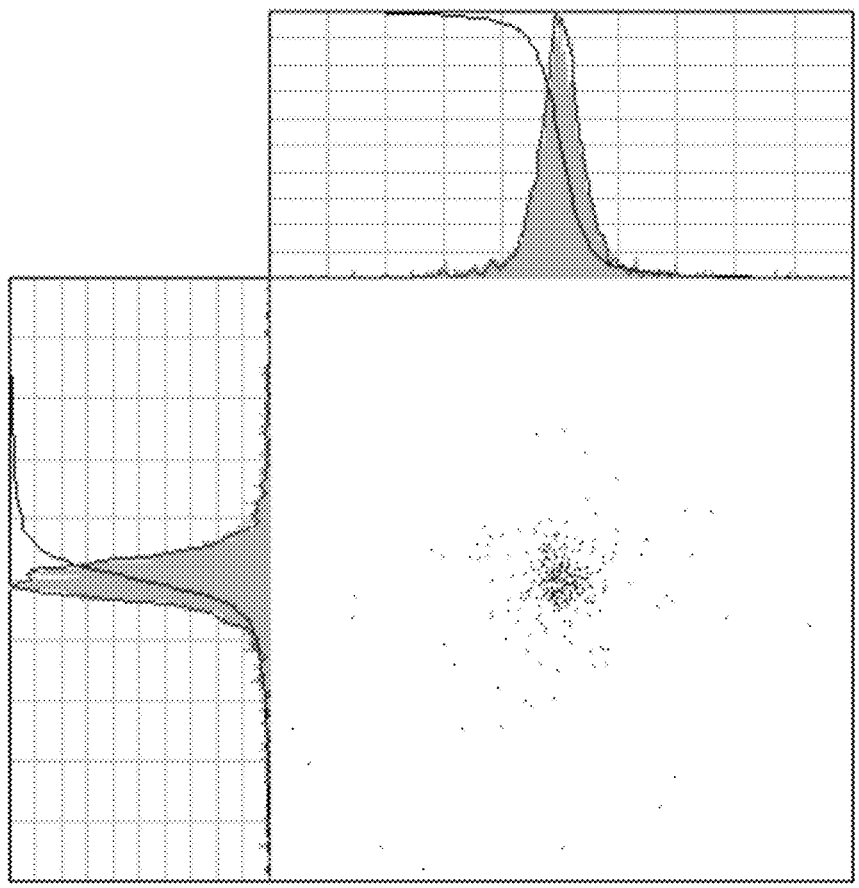

Accordingly, the electron optical configurations in FIGS. 6A-6C can remove most or all residual electrons below the BLA2. Thus, most of the extra blurs due to the CI trajectory displacement effect in FIG. 2 and FIG. 3 are removed. With the optical configurations in FIGS. 6A-6C, the optical resolutions and the electron distribution tails are improved. FIG. 7 shows the improvement with computer simulations using Monte Carlo methods. FIG. 7 shows resolution improvements of an electron gun with the beam spot electron distribution with the dual-aperture electron gun of FIG. 4 and FIG. 5.

As a reference, FIG. 3B shows the electron distributions of the beam spot at wafer using a previous design. FIG. 7 shows the electron distributions of the beam spot at wafer in the optical configuration in FIG. 6C. The conditions for simulating FIG. 3B and FIG. 7 are the same. Both conditions are 50 nA BC in 100 nA Iraw electrons of moving in 10 kV BE and landing in 1 keV LE. The most useful central spot size (FW50) in FIG. 7 is only a half of that in FIG. 3B. The tail of the electron distributions in FIG. 7 is much narrowed than that in FIG. 3B.

A large number of chip devices like 3D NAND flash, 3D DRAM, and 3D logic can be configured with numerous memory holes, channel holes, staircase steps, and deep trenches. To be able to collect the bottom signal of these holes, a narrow primary electron beam with short tails can be helpful in decreasing the signal pollutions from the hole channel walls and the rims of the channel surface. Thus, the electron beam of FIG. 7 can provide better resolution and better secondary electron/backscattered electron signal qualities compared to that of FIG. 3B.

FIG. 8 illustrates how the Coulomb interactions between the primary electrons and secondary electrons may take place in the region between BLA1 and BLA2. The trajectories of primary electrons and secondary electrons are shown in FIG. 8. Selected by the extractor, the anode current (Ianode) is formed from the emitted electrons from the tip to the plane of BLA1. Only part of the Ianode electron trajectories are shown in FIG. 8. The central portion of the anode current electrons passing through the BLA1 forms the first raw beam current Iraw1. A portion of the Iraw1 electrons bombards onto the BLA2 with the accelerated energy (i.e., the beam energy, BE). A small portion of the most central electrons passes through the BLA2 to form the second raw beam current Iraw2. The Iraw2 can be approximately equal to the final beam current (BC) to wafer.

Secondary electrons (SEs) are generated in the opposite direction of the primary electrons when the Iraw1 electrons bombard onto the BLA2. These secondary electrons will spirally move to the BLA1 in fairly low speeds to form secondary electron clouds in between the BLA1 and BLA2. These spiral SE trajectories are formed because of the penetration of the magnetic lens fields in the region between BLA1 and BLA2. The lower the positions close to BLA2, the weaker the penetrated magnetic field may be. Thus, the higher the position close to BLA1, the stronger the penetrated magnetic field may be. Accordingly, the closer to the BLA1, the more spiral motions of the secondary electrons with shorter space-period may be because of the stronger penetrated magnetic lens field. As a result, the primary electron beam resolution may be degraded because these electron trajectories can be displaced by the secondary electrons through Coulomb interactions.

To reduce the secondary electron clouds, the diameter of the channel between BLA1 and BLA2 (e.g., the dimension d in FIG. 8) can be adjusted to minimize the Coulomb interactions between PEs and SEs. SE clouds tend to be reduced as the channel diameter d is reduced. This is shown in FIG. 9.

In FIG. 9, the channel diameter d is designed to be relatively small (e.g., approximately 1 mm) so that most of the SEs with larger polar angles (e.g., 10 degrees to 90 degrees in FIG. 9) hit the wall of the channel before they are focused by the penetrated magnetic fields. A 1 mm diameter was selected to let the channel clip all secondary electrons with the polar angles greater than 5 degree, such that the influence of Coulomb interactions between primary electrons and secondary electrons on resolution is negligible. A smaller d may stop more secondary electrons, but may be more difficult to manufacture with high accuracy and good vacuum pumping.

The penetrated magnetic fields may be fairly weak in the bottom region of the channel. Only the SEs with small polar angles (e.g., 5 degrees or smaller) may be focused by the penetrated magnetic field and spirally move up to BLA1. Accordingly, the PE trajectory displacements due to Coulomb interactions can be reduced because the number of SEs moving close to the PEs in an opposite direction is largely reduced.

The embodiments of the electron gun with dual-apertures move the column aperture up to the gun region and use the post-crossover motions below the BLA2 to select beam currents. Most or all of the residual electrons below BLA2 are removed, which can reduce the influence of Coulomb interactions on the optical resolution. Previously, the beam currents were selected with a front-crossover method like FIG. 2, in which a crossover or crossovers are moved in front of a column aperture. A large number of residual electrons stay between the gun BLA and column aperture. For selecting a large range of beam currents, the distance between the gun BLA and column aperture may be long, such as from 100 mm to 200 mm (e.g., 140 mm to 150 mm). As a combined result, the residual electrons distributed in a long distance can induce severe Coulomb interactions and degrade the optical resolution through trajectory displacement effect.

Embodiments disclosed herein can simplify the electron optics in the electron optical column. Previous design with a front-crossover BC-selection method used a four-lens column like in FIG. 2. With the post-crossover BC-selection method, three lenses in a column optics can be used for any a given beam current, which simplifies the optical alignments and provides improved reliability.

Embodiments disclosed herein also can minimize Coulomb interactions between PEs and SEs. A narrow channel between BLA1 and BLA2 can collect the secondary electrons with larger polar angles (e.g., 10 degrees to 90 degrees) before these SEs are focused to travel long distances. A recessed anode to shrink the distance between BLA1 and BLA2 can be used such that the secondary electrons even with small polar angles (e.g., 5 degrees or smaller) are highly compressed to travel short moving paths.

The gun magnetic lens field can cause the spiral motion of the SEs in low speeds, forming the SE clouds in the region between BLA1 and BLA2 in FIG. 8. To avoid the strong penetration of the magnetic lens field near the BLA1, a recessed anode can be used, as shown in FIG. 10. The beam limiting assembly defines a recess 211 on the surface that receives the electron beam 204 from the electron source. The first beam limiting aperture 206 (BLA1) is disposed in a base of the recess 211. The recess has a fourth diameter that is larger than the first diameter and the second diameter of the BLAs. The fourth diameter also can be larger than the third diameter of the channel.

The recess 211 can let the acceleration field from the extractor to anode sufficiently penetrate to the BLA1 surface such that the low energy SEs from the BLA1 are immediately rejected back the BLA1 with approximately 1 mm spiral motion (FIGS. 11A-11B) to reduce the Coulomb interactions between PEs and SEs. The recess 211 also can compress the length of the channel between BLA1 and BLA2 and limit the SEs from BLA2 only to move near the BLA1 where the gun-lens magnetic field penetration is fairly weak.

The BLA1 in FIG. 10 is shifted down to compress the distance between the BLA1 and BLA2. This also can compress the spiral motion distance of the SEs generated at the BLA2 due to Iraw1 electron bombarding.

The diameter (d) of the channel between BLA1 and BLA2 in FIG. 10 may be equal to or even smaller than that in FIG. 4 because the channel is shorter. The inner diameter and conical cut of the recessed anode can be designed with computer simulations to sufficiently allow the acceleration field (from the extractor to anode) to penetrate to the top surface of the BLA1 and to reject the secondary electrons generated due to bombarding of the anode current electrons on the BLA1.

Figure 11B:
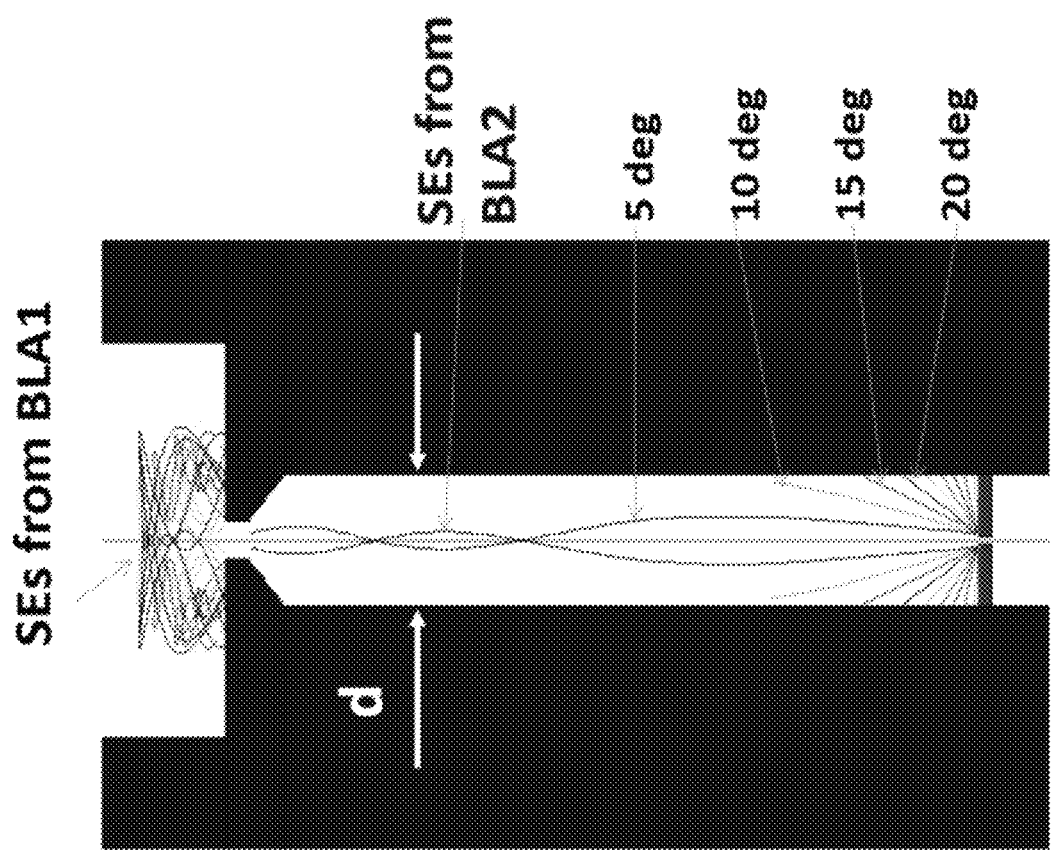
FIG. 11B shows an enlarged view of the secondary electrons in FIG. 11A.
Figure 11A:
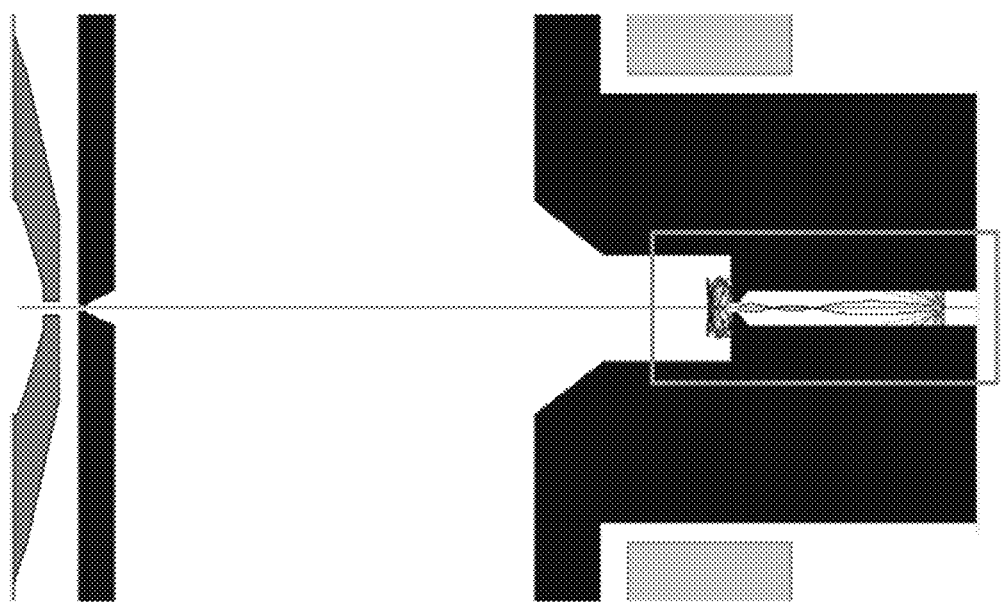
FIG. 11A shows computer simulations of secondary electron trajectories of the electron gun of FIG. 10.

FIG. 11A exhibits the reductions of secondary electrons with the electron gun with a recessed anode and dual-apertures of FIG. 10. With computer simulations, the secondary electron trajectories are plotted in FIG. 11A. FIG. 11B exhibits the enlarged view of the SE trajectories in FIG. 11A.

The spirally-moving SEs emitted from the BLA1 due to anode-current electron bombarding are immediately repelled back to BLA1 surface by the acceleration field. The height of the BLA1-SE cloud may only be less than 1 mm. This height may negligibly influence the PE trajectory displacements through Coulomb interactions according to the distance-accumulated principle in Equation 1.

Most of the spirally-moving SEs emitted from the BLA2 due to Iraw1-current electron bombarding divergently hit the wall of the narrow channel within about 1 mm height. As shown in the FIG. 11B with computer simulations, the SEs with the polar angle in approximately 10 degrees to 90 degrees are immediately collected by the channel wall, and only a small portion of the SEs with the polar angle being equal to or less than 5 degrees are spirally moving up to the BLA2. Because the distance between BLA1 and BLA2 is reduced with the recessed anode, the spirally-moving SEs are compressed with fewer spiral-periods when comparing the SE trajectories in FIG. 11B with those in FIG. 9. The secondary electrons can be prevented from escaping BLA2 as shown in FIG. 9 or FIG. 11B.

FIGS. 12A-12F show the experimental results with a range of beam currents (approximately 1 nA to 100 nA) to evaluate defect reviews, physical defect, hot spot inspections, and voltage contrast inspections. FIGS. 12A-12F are images with 1 nA, 3 nA, 10 nA, 50 nA, 75 nA, and 100 nA beam current, respectively. The resolutions in FIGS. 12A-12F are fairly good for these low (landing) energy (1 keV) applications. The good image resolutions for high BCs (e.g., approximately 50 nA to 100 nA) demonstrate that the Coulomb interactions between electrons have been largely reduced with the embodiments disclosed herein.

The experimental results were beneficial for high beam currents (e.g., from 50 nA to 100 nA) for voltage contrast wafer inspections. Because of the reduced Coulomb interactions (FIG. 7), the experimental images or resolutions degrade fairly slow with the increase of beam currents up to 100 nA. A conventional CDSEM apparatus or review apparatus can provide high resolution, because the beam current is low. In an instance, the beam current in a CDSEM is about 0.1 nA or below, and the beam current in a review tool is about 0.1 nA to 5 nA). Embodiments disclosed herein can provide high resolution for the wafer inspection (specifically the voltage contrast inspection) with high beam currents up to 100 nA.

Figure 13:
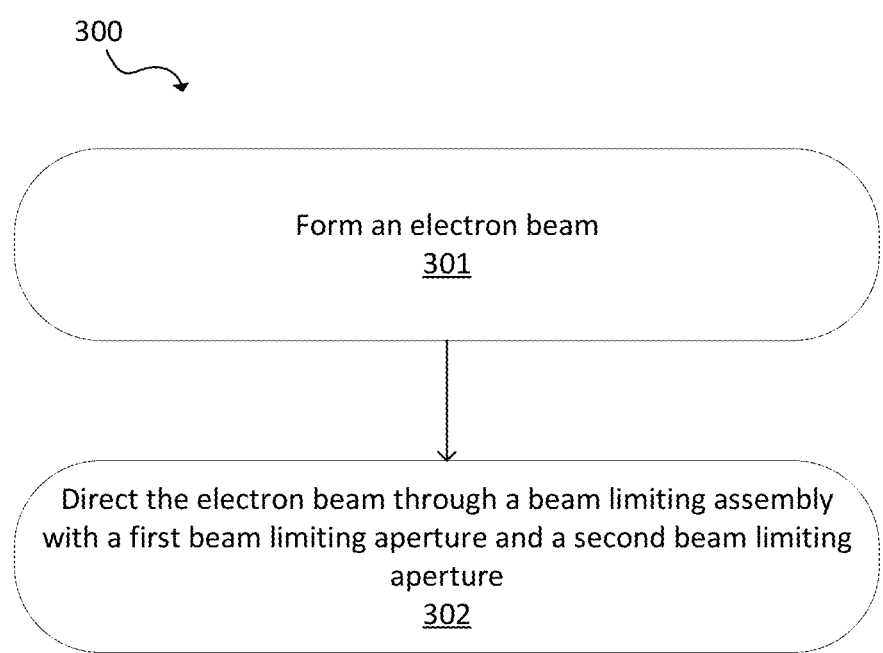
FIG. 13 is a flowchart of an embodiment of a method in accordance with the present disclosure.

FIG. 13 is a flowchart of an embodiment of a method 300, which can use any of the embodiments disclosed herein. An electron beam is formed at 301. The electron beam is directed through a beam limiting assembly at 302. The beam limiting assembly defines a first beam limiting aperture with a first diameter, a second beam limiting aperture with a second diameter, and a channel between the first beam limiting aperture and the second beam limiting aperture. The channel has a third diameter larger than that of the first diameter of the first beam limiting aperture and the second diameter of the second beam limiting aperture. The beam limiting assembly is positioned to receive the electron beam in the first beam limiting aperture.

The electron beam can be focused to form a crossover after the electron beam exits the beam limiting assembly. The electron beam also can be defocused after the electron beam exits the beam limiting assembly.

In an instance, the electron beam can be directed through a condenser lens that is activated and disposed downstream along a path of the electron beam from the beam limiting assembly, an aperture disposed downstream along the path of the electron beam from the condenser lens, and an objective lens disposed downstream along the path of the electron beam from the aperture. A beam current of the electron beam can be from 0.1 nA to 20 nA or from 60 nA to 500 nA.

In another instance, the electron beam can be directed through an aperture disposed downstream along a path of the electron beam from the beam limiting assembly, a condenser lens that is activated and disposed downstream along the path of the electron beam from the aperture, and an objective lens disposed downstream along the path of the electron beam from the condenser lens. A beam current of the electron beam can be from 20 nA to 60 nA.

The electron beam can be directed to a surface of a semiconductor wafer. A beam current selected by the second beam limiting aperture can be equal to a beam current at the surface of the semiconductor wafer.

The electron beam can be directed through a recess on a surface of the beam limiting assembly that receives the electron beam from the electron source. The first beam limiting aperture is disposed in a base of the recess. The recess has a fourth diameter that is larger than the first diameter and the second diameter.

While described with respect to an electron beam, the embodiments disclosed herein also can be used with an ion beam or a particle beam.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
an electron source configured to emit an electron beam;
a suppression electrode disposed proximate the electron source;
an extraction electrode disposed proximate the electron source;
a beam limiting assembly defining a first beam limiting aperture with a first diameter, a second beam limiting aperture with a second diameter, and a channel between the first beam limiting aperture and the second beam limiting aperture, wherein the channel has a third diameter larger than that of the first diameter of the first beam limiting aperture and the second diameter of the second beam limiting aperture, wherein the beam limiting assembly is positioned to receive the electron beam in the first beam limiting aperture, and wherein the first diameter is from 1.5 to 5.0 times larger than the second diameter; and
at least one pole piece disposed adjacent the beam limiting assembly.

2. The system of claim 1, wherein the beam limiting assembly includes a flange on a surface of the beam limiting assembly that receives the electron beam from the electron source, wherein the flange is disposed between the electron source and the at least one pole piece.

3. The system of claim 1, wherein the first beam limiting aperture is disposed closer to the electron source than the second beam limiting aperture.

4. The system of claim 1, wherein the beam limiting aperture further includes a transition region between the first beam limiting aperture and the channel, wherein the transition region has a diameter that increases from the first diameter to the third diameter, and wherein the transition region has a length along the direction of the electron beam that is from 1 mm to 10 mm.

5. The system of claim 4, wherein the third diameter is configured to stop a majority of the secondary electrons without clipping the primary electrons.

6. The system of claim 1, further comprising an objective lens, an aperture disposed in a path of the electron beam between the beam limiting assembly and the objective lens, and a condenser lens disposed in the path of the electron beam between the aperture and the beam limiting assembly.

7. The system of claim 1, further comprising an objective lens, an aperture disposed in a path of the electron beam between the beam limiting assembly and the objective lens, and a condenser lens disposed in the path of the electron beam between the aperture and the objective lens.

8. The system of claim 1, wherein the beam limiting assembly defines a recess on the surface that receives the electron beam from the electron source, wherein the first beam limiting aperture is disposed in a base of the recess, and wherein the recess has a fourth diameter that is larger than the first diameter and the second diameter.

9. The system of claim 1, wherein the second beam limiting aperture is spaced apart from the first beam limiting aperture from 5 mm to 10 mm along a path of the electron beam.

10. The system of claim 1, wherein the third diameter is approximately 1 mm in diameter and a length of the channel is from 6 mm to 12 mm.

11. A method comprising:
forming an electron beam; and
directing the electron beam through a beam limiting assembly, wherein the beam limiting assembly defines a first beam limiting aperture with a first diameter, a second beam limiting aperture with a second diameter, and a channel between the first beam limiting aperture and the second beam limiting aperture, wherein the channel has a third diameter larger than that of the first diameter of the first beam limiting aperture and the second diameter of the second beam limiting aperture, wherein the beam limiting assembly is positioned to receive the electron beam in the first beam limiting aperture, and wherein the first diameter is from 1.5 to 5.0 times larger than the second diameter.

12. The method of claim 11, further comprising focusing the electron beam to form a crossover after the electron beam exits the beam limiting assembly.

13. The method of claim 11, further comprising defocusing the electron beam after the electron beam exits the beam limiting assembly.

14. The method of claim 11, wherein a beam current of the electron beam is from 1 nA to 100 nA.

15. The method of claim 11, further comprising directing the electron beam through a condenser lens that is activated and disposed downstream along a path of the electron beam from the beam limiting assembly, an aperture disposed downstream along the path of the electron beam from the condenser lens, and an objective lens disposed downstream along the path of the electron beam from the aperture.

16. The method of claim 15, wherein a beam current of the electron beam is from 0.1 nA to 20 nA or from 60 nA to 500 nA.

17. The method of claim 11, further comprising directing the electron beam through an aperture disposed downstream along a path of the electron beam from the beam limiting assembly, a condenser lens that is activated and disposed downstream along the path of the electron beam from the aperture, and an objective lens disposed downstream along the path of the electron beam from the condenser lens.

18. The method of claim 17, wherein a beam current of the electron beam is from 20 nA to 60 nA.

19. The method of claim 11, further comprising directing the electron beam to a surface of a semiconductor wafer, wherein a beam current selected by the second beam limiting aperture is equal to a beam current at the surface of the semiconductor wafer.

20. The method of claim 11, further comprising directing the electron beam through a recess on a surface of the beam limiting assembly that receives the electron beam from the electron source, wherein the first beam limiting aperture is disposed in a base of the recess, and wherein the recess has a fourth diameter that is larger than the first diameter and the second diameter.

21. The method of claim 11, wherein the electron beam passes through the channel, and wherein the third diameter is configured to stop a majority of secondary electrons without clipping primary electrons.

* * * * *